(12) United States Patent
Park et al.

(10) Patent No.: US 10,916,603 B2
(45) Date of Patent: Feb. 9, 2021

(54) DISPLAY DEVICE AND FABRICATION METHOD THEREOF

(71) Applicant: SAMSUNG DISPLAY CO., LTD., Yongin-si (KR)

(72) Inventors: Myoungjin Park, Hwaseong-si (KR); Youngji Kim, Hwaseong-si (KR); Youngseo Choi, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 145 days.

(21) Appl. No.: 16/139,366

(22) Filed: Sep. 24, 2018

(65) Prior Publication Data
US 2019/0198587 A1 Jun. 27, 2019

(30) Foreign Application Priority Data
Dec. 21, 2017 (KR) .......................... 10-2017-0177457

(51) Int. Cl.
*H01L 27/32* (2006.01)
*H01L 51/52* (2006.01)
(Continued)

(52) U.S. Cl.
CPC ....... *H01L 27/3246* (2013.01); *G09G 3/3266* (2013.01); *G09G 3/3291* (2013.01);
(Continued)

(58) Field of Classification Search
CPC ............. H01L 27/3246; H01L 27/3258; H01L 27/3244; H01L 27/3223; H01L 51/5253; H01L 51/5256
See application file for complete search history.

(56) References Cited

U.S. PATENT DOCUMENTS 8,492,974 B2 7/2013 Lee et al.
9,391,296 B2 7/2016 Park et al.
(Continued)

FOREIGN PATENT DOCUMENTS

| KR | 10-20150025994 | 3/2015 |
|---|---|---|
| KR | 10-2017-0029706 | 3/2017 |
| KR | 10-1763616 | 7/2017 |

OTHER PUBLICATIONS

Chaudhury, M. K., & Chaudhury, A. (2005). Super spreading of oil by condensed water drops. Soft matter, 1(6), 431-435.
(Continued)

*Primary Examiner* — Jose R Diaz
(74) *Attorney, Agent, or Firm* — F. Chau & Associates, LLC

(57) ABSTRACT

A display device includes a substrate that includes a display region and a non-display region that surrounds the display region, a plurality of pixels disposed on the display region of the substrate, a plurality of dam members disposed on the non-display region of the substrate that surround the display region, a first encapsulation layer disposed on the substrate that covers the pixels and the dam members, and a second encapsulation layer disposed on the first encapsulation layer and in a region between the display region and a dam member of the plurality of the dam members that is adjacent to the display region. A surface roughness of a top surface of the second encapsulation layer is greater than a surface roughness of a top surface of the first encapsulation layer.

19 Claims, 12 Drawing Sheets

(51) Int. Cl.
*H01L 51/50* (2006.01)
*G09G 3/3291* (2016.01)
*H01L 51/56* (2006.01)
*G09G 3/3266* (2016.01)

(52) U.S. Cl.
CPC ...... *H01L 27/3223* (2013.01); *H01L 27/3258* (2013.01); *H01L 51/5012* (2013.01); *H01L 51/5203* (2013.01); *H01L 51/5237* (2013.01); *H01L 51/5253* (2013.01); *H01L 51/5256* (2013.01); *H01L 51/56* (2013.01); *G09G 2300/0426* (2013.01); *G09G 2310/08* (2013.01)

(56) References Cited

U.S. PATENT DOCUMENTS 9,797,567 B2 * 10/2017 Kastner-Jung ........... B60Q 3/30

| | | | |
|---|---|---|---|
| 2016/0064691 A1 * | 3/2016 | Lee | H01L 51/5275 257/40 |
| 2016/0204373 A1 * | 7/2016 | Park | H01L 27/3246 257/40 |
| 2017/0033312 A1 | 2/2017 | Kim et al. | |
| 2017/0069873 A1 | 3/2017 | Kim et al. | |

OTHER PUBLICATIONS

Oil spreads faster on water droplets[online], Dec. 12, 2005, [retrieved on Apr. 2, 2018], Retrieved from the Internet:<https://www.chemistryworld.com/news/oilspreads-faster-on-water-droplets/3003043.article>.

Effects of contact angles[online], Soft Matter, Dec. 7, 2008, [retrieved on Apr. 2, 2018] Retrieved from the Internet:<URL:http://softmatter.seas.harvard.edu/index.php/Effects_of_contact_angles>.

* cited by examiner

DISPLAY DEVICE AND FABRICATION METHOD THEREOF

CROSS-REFERENCE TO RELATED APPLICATIONS

This U.S. non provisional patent application claims priority under 35 U.S.C. § 119 from, and the benefit of, Korean Patent Application No. 102017-0177457, filed on Dec. 21, 2017 in the Korean Intellectual Property Office, the contents of which are herein incorporated by reference in their entirety.

BACKGROUND

Embodiments of the present disclosure are directed to a display device and a method of fabricating the same, and in particular, to a display device that includes a thin encapsulation layer and a method of fabricating the same.

An organic light emitting display device is a display device in which an organic material is used as a light emitting device. In an organic light emitting display device, recombinations of electrons and holes are used to generate light, and such light is used to display an image. An organic light emitting display device does not require an additional light source, unlike a liquid crystal display device, and have excellent brightness and a wide viewing angle. In addition, an organic light omitting display device has a fast response speed and a low power consumption.

To fabricate a organic light emitting display device, a plurality of pixels that include light-emitting devices are formed on a substrate, and then, a thin encapsulation layer is provided on the substrate to cover the pixels. The thin encapsulation layer includes an inorganic insulating layer and an organic insulating layer. The organic insulating layer is formed by forming a fluidic organic material on the substrate and then curing the organic material. When providing the organic material on the substrate, the fluidic organic material may flow toward an unintended region or may overflow the substrate.

SUMMARY

Some embodiments of the inventive concept provide an organic material for a thin encapsulation layer in a desired region and can prevent the organic material from overflowing the substrate, a method of fabricating a display device, and a display device fabricated thereby.

According to some embodiments of the inventive concept, a display device includes a substrate that includes a display region and a non-display region that surrounds the display region, a plurality of pixels disposed on the display region of the substrate, a plurality of dam members disposed on the non-display region of the substrate that surround the display region, a first encapsulation layer disposed on the substrate that covers the pixels and the dam members, and a second encapsulation layer disposed on the first encapsulation layer and in a region between the display region and a dam member of the plurality of the dam members that is adjacent to the display region. A surface roughness of a top surface of the second encapsulation layer may be greater than a surface roughness of a top surface of the first encapsulation layer.

In some embodiments, a thickness of the second encapsulation layer may be less than a thickness of the first encapsulation layer.

In some embodiments, the surface roughness of the second encapsulation layer may range from 8.4 nm to 35 nm, and the surface roughness of the first encapsulation layer may range from 0.9 nm to 2 nm.

According to some embodiments of the inventive concept, a display device includes a substrate that includes a display region and a non-display region that surrounds the display region; a plurality of pixels disposed on the display region of the substrate; a plurality of dam members disposed on the non-display region of the substrate that surround the display region; a first encapsulation layer disposed on the substrate that covers the plurality of pixels and the plurality of dam members; and a second encapsulation layer disposed on the first encapsulation layer and in a region between the display region and a dam member of the plurality of dam members that is adjacent to the display region. The first encapsulation layer comprises silicon oxynitride, the second encapsulation layer comprises silicon oxynitride or silicon oxide, and the first and second inorganic materials differ from each other in terms of composition ratios of silicon, oxygen, and nitrogen.

According to some embodiments of the inventive concept, a method of fabricating a display device includes preparing a substrate that includes a display region and a non-display region that surrounds the display region, forming a plurality of pixels on the display region of the substrate, forming a plurality of dam members on the non-display region of the substrate to surround the display region, forming a first encapsulation layer on the substrate that covers the pixels and the dam members, and forming a second encapsulation layer on the first encapsulation layer and in a region between the display region and a dam member of the plurality of dam members that is adjacent to the display region. The second encapsulation layer has a top surface whose surface roughness is greater than a surface roughness of a top surface of the first encapsulation layer.

Figure 1:
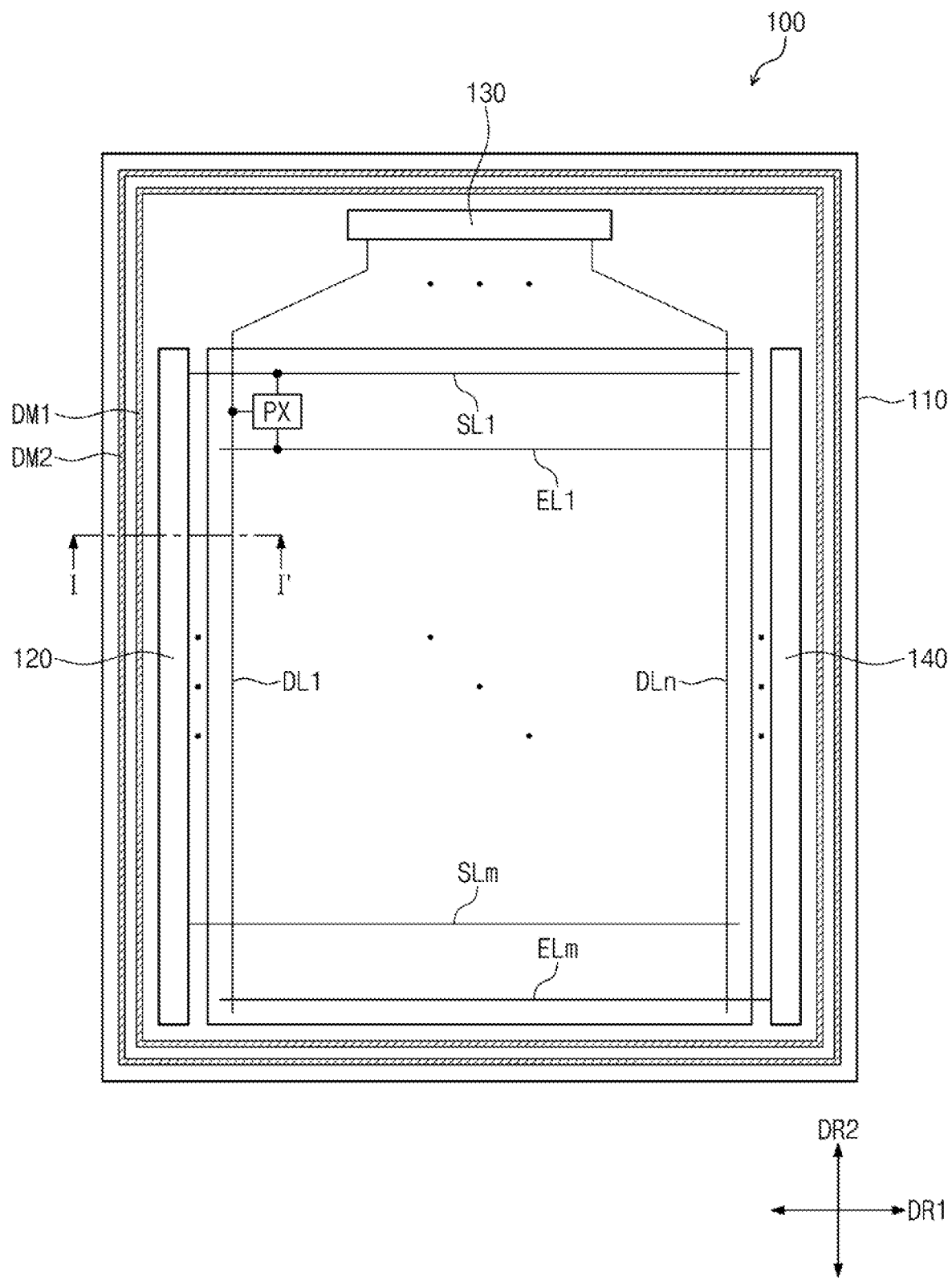
FIG. 1 is a plan view of a display device according to some embodiments of the inventive concept.

It should be noted that these figures are intended to illustrate the general characteristics of methods, structure and/or materials utilized in certain example embodiments and to supplement the written description provided below. However, the relative thicknesses and positioning of molecules, layers, regions and/or structural elements may be reduced or exaggerated for clarity. The use of similar or identical reference numbers in the various drawings may indicate the presence of a similar or identical element or feature.

DETAILED DESCRIPTION

Exemplary embodiments of the inventive concept will now be described more fully with reference to the accompanying drawings, in which exemplary embodiments are shown. Exemplary embodiments of the inventive concept may, however, be embodied in many different forms and should not be construed as being limited to the embodiments set forth herein. In the drawings, the thicknesses of layers and regions may be exaggerated for clarity. Like reference numerals in the drawings may denote like elements, and thus their description will be omitted.

It will be understood that when an element is referred to as being "connected" or "coupled" to another element, it can be directly connected or coupled to the other element or intervening elements may be present.

FIG. 1 is a plan view of a display device according to some embodiments of the inventive concept.

Referring to FIG. 1, according to embodiments, a display device 100 includes a display panel 110, a scan driver 120, a data driver 130, an emission driver 140, and a plurality of dam members DM1 and DM2. The display panel 110 may be an organic light emitting display panel, but embodiments of the inventive concept are not limited thereto. For example, other types of display panels, such as a liquid crystal display panel, an electrowetting display panel, or an electrophoretic display panel, can be used as the display panel 110.

According to an embodiment, the display panel 110 is a flexible display panel. The display panel 110 has a rectangular shape whose short sides are parallel to a first direction DR1 and whose long sides are parallel to a second direction DR2 that crosses the first direction DR1. The display panel 110 has a flat surface which is parallel to a plane defined by the first direction DR1 and the second direction DR2, and the flat surface of the display panel 110 includes a display region DA and a non-display region NDA surrounding the display region DA. The display region DA is used to display an image, and the non-display region NDA is not used to display an image.

According to an embodiment, the display panel 110 includes a plurality of pixels PX, a plurality of scan lines SL1-SLm, a plurality of data lines DL1-DLn, and a plurality of light-emitting lines EL1-Elm, where m and n are natural numbers. For convenience in illustration, only one pixel PX is illustrated in FIG. 1, but actually, the plurality of pixels PX are provided in the display panel 110. The pixels PX are arranged in a matrix shape in the display region DA and are connected to the scan lines SL1-SLm, the data lines DL1-DLn, and the light-emitting lines EL1-ELm.

According to an embodiment, the scan driver 120, the data driver 130, and the emission driver 140 are provided in the non-display region NDA. The scan driver 120 is disposed in a region of the non-display region NDA along one of long sides of the display panel 110. The emission driver 140 is disposed in another region of the non-display region NDA along an opposite one of the long sides of the display panel 110. The data driver 130 is an integrated circuit chip and is disposed in other region of the non-display region NDA along one of short sides of the display panel 110.

According to an embodiment, the scan lines SL1-SLm extend in the first direction DR1 from connections with the scan driver 120 and receive scan signals from the scan driver 120. The data lines DL1-DLn extend in the second direction DR2 from connections with the data driver 130 and receive data voltages from the data driver 130. The light-emitting lines EL1-Elm extend in the first direction DR1 from connections with the emission driver 140 and receive light emitting signals from the emission driver 140.

According to an embodiment, the scan driver 120 generates a plurality of scan signals that are transmitted to the pixels PX through the scan lines SL1-SLm. The scan signals are sequentially transmitted to the pixels PX. The data driver 130 generates a plurality of data voltages that are transmitted to the pixels PX through the data lines DL1-DLn. The emission driver 140 generates a plurality of light emitting signals that are transmitted to the pixels PX through the light-emitting lines EL1-ELm.

According to an embodiment, the display device 100 includes a timing controller that controls operations of the scan driver 120, the data driver 130, and the emission driver 140. The timing controller generates scan control signals, data control signals, and light-emitting control signals in response to control signals received from the outside. In addition, the timing controller receives image signals from the outside, converts the image signals into a data format compatible with the specifications of the data driver 130, and transmits the converted image data to the data driver 130.

According to an embodiment, the scan driver 120 generates scan signals in response to the scan control signal, and the emission driver 140 generates light emitting signals in response to the light-emitting control signal. The data driver 130 receives the converted image data and then generates data voltages corresponding to the converted image data, in response to the data control signal.

According to an embodiment, the pixels PX receive data voltages in response to the scan signals. The pixels PX emit light having a brightness level corresponding to the data voltage in response to the light emitting signals to display an image. A light-emitting duration of the pixel PX is controlled by the light emitting signals.

According to an embodiment, the dam members DM1 and DM2 are disposed in the non-display region NDA and surround the display region DA. The dam members DM1 and DM2 extend along an edge region of the display panel 110 and surround the scan driver 120, the data driver 130, and the emission driver 140. Two dam members DM1 and DM2 are illustrated as an example of the inventive concept, but embodiments are not limited thereto, and the number of the dam members DM1 and DM2 is not limited to two.

According to an embodiment, the dam members DM1 and DM2 include a first dam member DM1 which surrounds the display region DA, and a second dam member DM2 which surrounds the first dam member DM1. The first and second dam members DM1 and DM2 will be described in more detail below.

Figure 2:
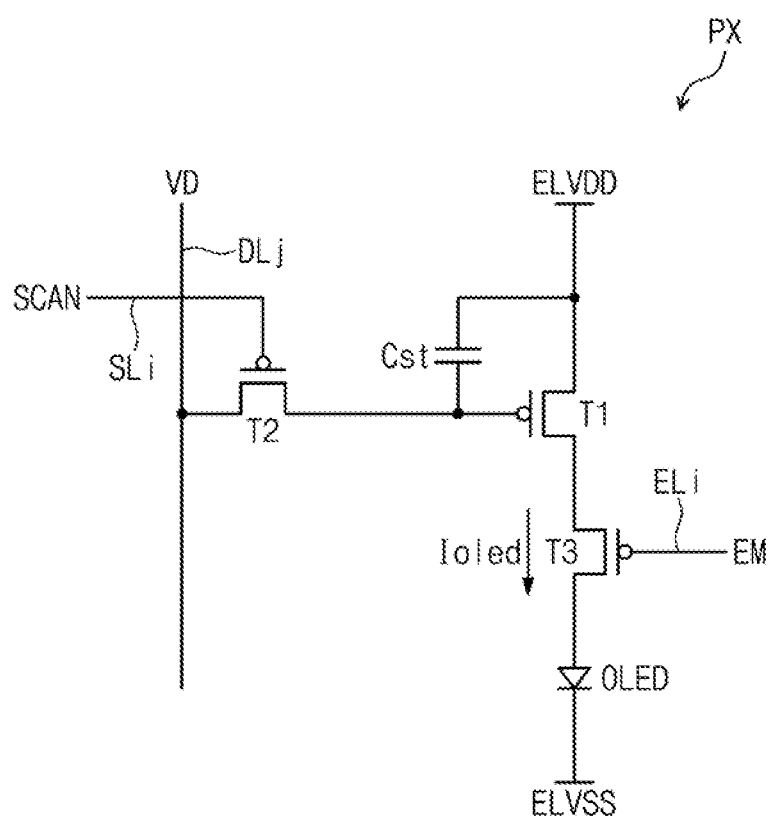
FIG. 2 is an equivalent circuit diagram of a pixel of FIG. 1.

FIG. 2 is an equivalent circuit diagram of a pixel of FIG. 1.

Although only one pixel PX is illustrated in FIG. 2, the pixels PX of the display panel 110 have the same structure as the pixel PX shown in FIG. 2.

Referring to FIG. 2, according to an embodiment, the pixel PX is connected to a corresponding one (e.g., SLi) of the scan lines SL1-SLm, a corresponding one (e.g., DLj) of the data lines DL1-DLn, and a corresponding one (e.g., ELi) of the light-emitting lines EL1-Elm, where i is a natural number less than or equal to m and j is a natural number less than or equal to n. The pixel PX includes a light-emitting device OLED, a driving transistor T1, a capacitor Cst, a switching transistor T2, and a light-emitting control transistor T3. The light-emitting device OLED is an organic light emitting diode.

According to an embodiment, a first voltage ELVDD is transmitted to a source terminal of the driving transistor T1, and a drain terminal of the driving transistor T1 is connected to a source terminal of the light-emitting control transistor T3. A gate terminal of the driving transistor T1 is connected to a drain terminal of the switching transistor T2.

According to an embodiment, a gate terminal of the switching transistor T2 is connected to the scan line SLi, and a source terminal of the switching transistor T2 is connected to the data line DLj. A first electrode of the capacitor Cst is connected to the source terminal of the driving transistor T1, and a second electrode of the capacitor Cst is connected to the gate terminal of the driving transistor T1.

According to an embodiment, a gate terminal of the light-emitting control transistor T3 is connected to the light-emitting line ELi, and a drain terminal of the light-emitting control transistor T3 is connected to an anode electrode of the light-emitting device OLED. A cathode electrode of the light-emitting device OLED receives a second voltage ELVSS. The second voltage ELVSS has a voltage level lower than that of the first voltage ELVDD.

According to an embodiment, the switching transistor T2 is turned on in response to a scan signal SCAN received through the scan line SLi. When the switching transistor T2 is turned on, a data voltage VD received through the data line DLj is transmitted to the gate terminal of the driving transistor T1. The capacitor Cst is charged to the data voltage VD transmitted to the gate terminal of the driving transistor T1 and is maintained at the data voltage VD, even after the switching transistor T2 is turned off.

According to an embodiment, when a light-emitting signal EM is received by the gate terminal of the light-emitting control transistor T3 through the light-emitting line Eli, the light-emitting control transistor T3 is turned on in response to the light-emitting signal EM. In this case, the light-emitting control transistor T3 is used to transmit a current Ioled from the driving transistor T1 to the organic light emitting diode OLED. The pixel PX emits light during a period in which it receives the light-emitting signal EM. An intensity of light emitted from the light-emitting device OLED can change depending on the magnitude of the current Ioled.

According to an embodiment, the transistors T1-T3 of the pixel PX may be PMOS transistors, but embodiments of the inventive concept are not limited thereto. For example, the transistors T1-T3 of the pixel PX may be NMOS transistors.

Figure 3:
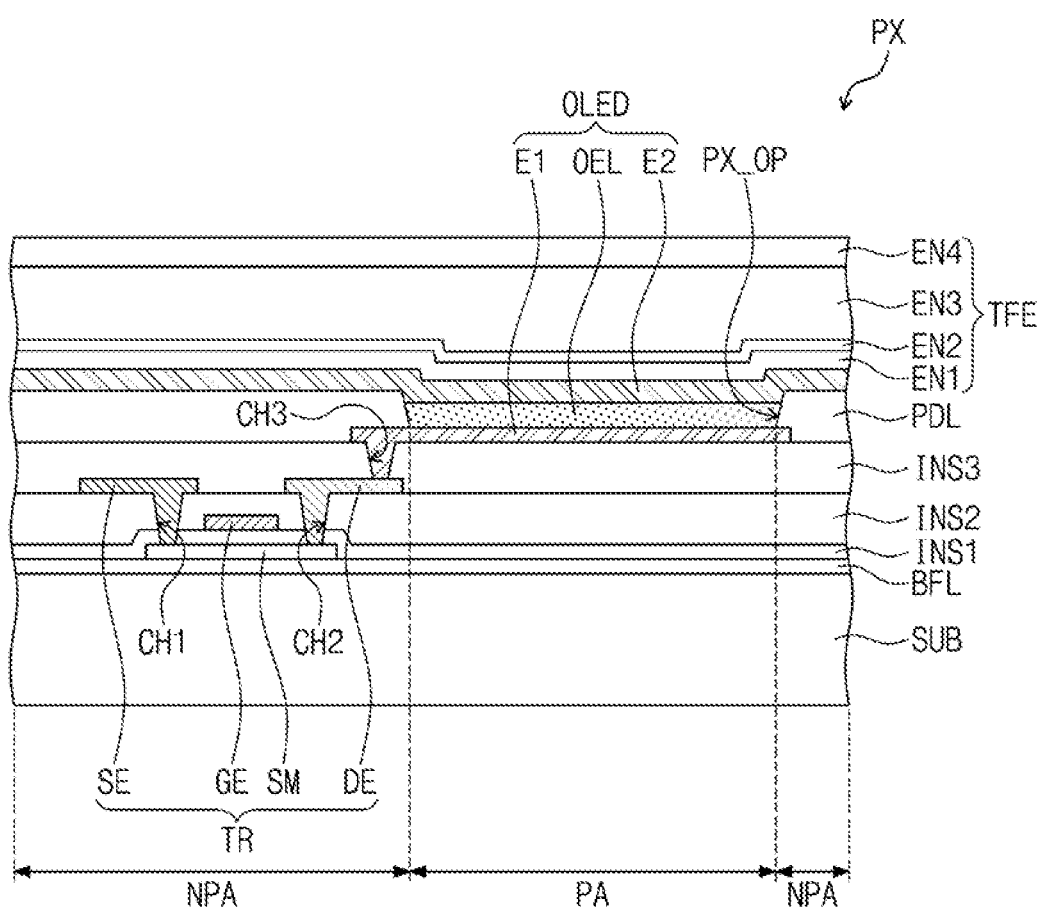
FIG. 3 is a sectional view of a pixel of FIG. 2.

FIG. 3 is a sectional view of a pixel of FIG. 2.

Referring to FIG. 3, according to an embodiment, the pixel PX includes the light-emitting device OLED and a transistor TR connected to the light-emitting device OLED. The transistor TR is the light-emitting control transistor T3. The transistor TR and the light-emitting device OLED are disposed on a substrate SUB, and the substrate SUB is a transparent flexible substrate formed of a flexible plastic material. For example, the substrate SUB may be formed of or include polyimide (PI).

According to an embodiment, a buffer layer BFL is disposed on the substrate SUB and is formed of or includes an inorganic material. A semiconductor layer SM of the transistor TR is provided on the buffer layer BFL. The semiconductor layer SM may be formed of or include an inorganic semiconductor material, such as amorphous silicon or poly silicon, or an organic semiconductor material. In addition, the semiconductor layer SM may be formed of or include an oxide semiconductor material. In addition, the semiconductor layer SM includes a source region, a drain region, and a channel region between the source region and the drain region.

According to an embodiment, a first insulating layer INS1 is disposed on the buffer layer BFL that covers the semiconductor layer SM. The first insulating layer INS1 is formed of or includes an inorganic material. A gate electrode GE of the transistor TR is disposed on the first insulating layer INS1 that overlaps the semiconductor layer SM. The gate electrode GE overlaps the channel region of the semiconductor layer SM.

According to an embodiment, a second insulating layer INS2 is disposed on the first insulating layer INS1 that covers the gate electrode GE. The second insulating layer INS2 is an interlayer insulating layer. The second insulating layer INS2 is formed of or includes an organic material and/or an inorganic material.

According to an embodiment, a source electrode SE and a drain electrode DE of the transistor TR are disposed on the second insulating layer INS2 and are spaced apart from each other. The source electrode SE is connected to a source region of the semiconductor layer SM through a first contact hole CH1 that penetrates the first insulating layer INS1 and the second insulating layer INS2. The drain electrode DE is connected to a drain region of the semiconductor layer SM through a second contact hole CH2 that penetrates the first insulating layer INS1 and the second insulating layer INS2.

According to an embodiment, a third insulating layer INS3 is disposed on the second insulating layer INS2 that covers the source electrode SE and the drain electrode DE of the transistor TR. The third insulating layer INS3 is a planarization layer that provides a flat top surface and is formed of or includes an organic material.

According to an embodiment, a first electrode E1 of the light-emitting device OLED is disposed on the third insulating layer INS3. The first electrode E1 is connected to the drain electrode DE of the transistor TR through a third contact hole CH3 that penetrates the third insulating layer INS3. The first electrode E1 is a pixel electrode or an anode electrode. The first electrode E1 includes a transparent electrode or reflective electrode.

According to an embodiment, a pixel definition layer PDL is disposed on the first electrode E1 and the third insulating layer INS3 and exposes a portion of the first electrode E1. A pixel opening PX_OP in the pixel definition layer PDL exposes a specific portion of the first electrode E1, and a region having the pixel opening PX_OP is defined as a pixel region PA. A region around the pixel region PA is defined as a non-pixel region NPA.

According to an embodiment, an organic light emitting layer OEL is disposed in the pixel opening PX_OP and on the first electrode E1. The organic light emitting layer OEL is formed of or includes an organic material that can generate one of red, green, or blue light. However, embodiments of the inventive concept are not limited thereto, and the organic light emitting layer OEL may be formed of organic materials that can combine red, green, and blue lights to generate a white light.

According to an embodiment, the organic light emitting layer OEL is formed of or includes a low molecular organic material or a polymer organic material. In addition, the organic light emitting layer OEL has a multi-layered structure that includes a hole injection layer (HIL), a hole transporting layer (HTL), a light emitting layer (EML), an electron transporting layer (ETL), and an electron injection layer (EIL). The hole injection layer is disposed on the first electrode E1, and the hole transporting layer, the light emitting layer, the electron transporting layer, and the electron injection layer are sequentially stacked on the hole injection layer.

According to an embodiment, a second electrode E2 is disposed on the pixel definition layer PDL and the organic light emitting layer OEL. The second electrode E2 is a common electrode or a cathode electrode. The second electrode E2 includes a transparent electrode or a reflective electrode.

According to an embodiment, when the display panel 110 is a top-emission type organic light emitting display panel, the first electrode E1 and the second electrode E2 serve as a reflective electrode and a transparent electrode, respectively. According to an embodiment, when the display panel 110 is a bottom-emission type organic light emitting display panel, the first electrode E1 and the second electrode E2 serve as a transparent electrode and a reflective electrode, respectively.

According to an embodiment, the light-emitting device OLED is formed in the pixel region PA and includes the first electrode E1, the organic light emitting layer OEL, and the second electrode E2 in the pixel region PA. The first electrode E1 is a hole injection electrode or a positive electrode, and the second electrode E2 is an electron injection electrode or a negative electrode.

According to an embodiment, a thin encapsulation layer TFE is disposed on the substrate SUB that covers the pixel PX. The thin encapsulation layer TFE includes a first encapsulation layer EN1 on the substrate SUB that covers the light-emitting device OLED, a second encapsulation layer EN2 on the first encapsulation layer EN1, a third encapsulation layer EN3 on the second encapsulation layer EN2, and a fourth encapsulation layer EN4 on the third encapsulation layer EN3. Each of the first, second, and fourth encapsulation layers EN1, EN2, and EN4 is formed of or includes an inorganic insulating material, and the third encapsulation layer EN3 is formed of or includes an organic insulating material.

According to an embodiment, to allow the organic light emitting layer OEL of the light-emitting device OLED to emit light, the first voltage ELVDD is transmitted to the first electrode E1 through the transistor TR, and the second voltage ELVSS, whose sign is opposite to the first voltage ELVDD, is transmitted to the second electrode E2. Holes and electrons injected into the organic light emitting layer OEL combine to form excitons, and light is emitted from the light-emitting device OLED when the excitons decay back to a ground state. The light-emitting device OLED emits red, green, or blue light to display an image.

Figure 4:
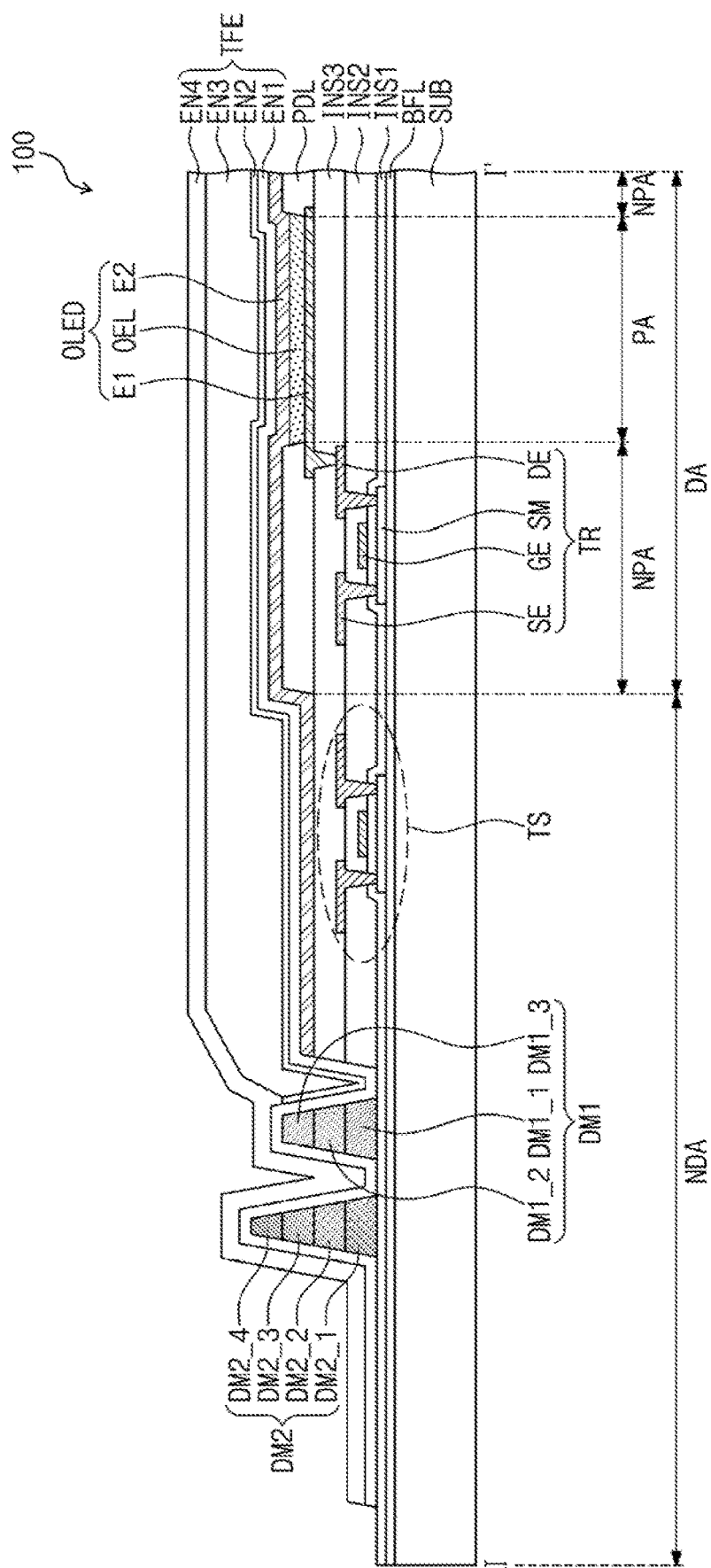
FIG. 4 is a sectional view taken along line I-I' of FIG. 1.
Figure 5:
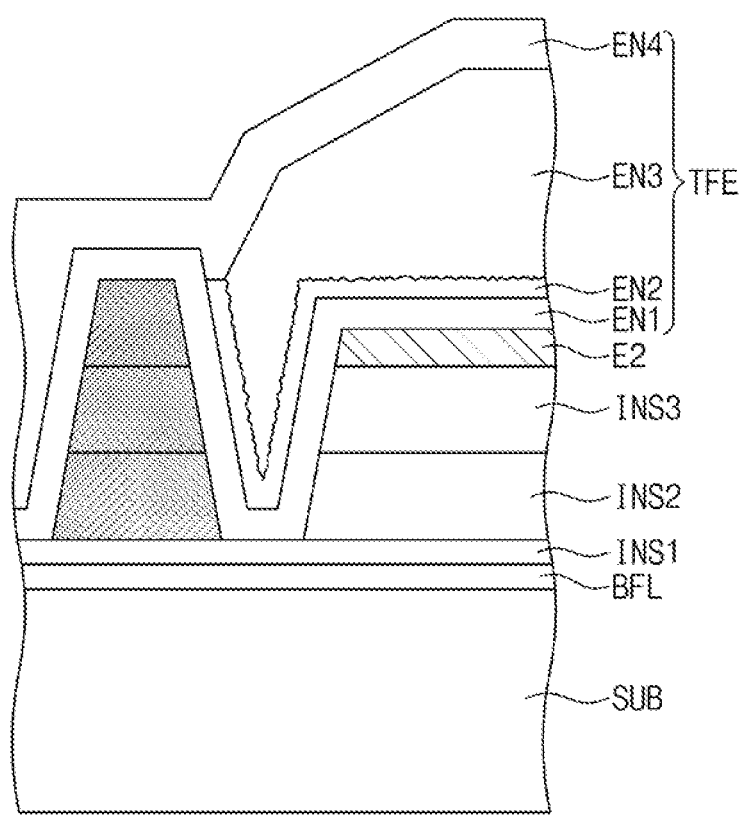
FIG. 5 is an enlarged sectional view of an end portion of a second encapsulation layer shown in FIG. 4.

FIG. 4 is a sectional view taken along line I-I' of FIG. 1. FIG. 5 is an enlarged sectional view of an end portion of a second encapsulation layer shown in FIG. 4.

Referring to FIGS. 4 and 5, according to an embodiment, the substrate SUB includes a display region DA and a non-display region NDA, and the display region DA of the substrate SUB includes the pixel region PA and the non-pixel region NPA. The pixel PX is disposed on the display region DA of the substrate SUB. The first and second dam members DM1 and DM2 are disposed on the non-display region NDA of the substrate SUB and enclose the display region DA.

According to an embodiment, the scan driver 120 includes a plurality of transistors, and the transistors of the scan driver 120 are disposed on the substrate SUB. For convenience of illustration, only one transistor TS of the scan driver 120 is illustrated in FIG. 4. Furthermore, in a sectional view of FIG. 4, a region with the scan driver 120 is shown as being smaller than an actual region.

According to an embodiment, the buffer layer BFL and the first insulating layer INS1 are disposed on the display region DA and the non-display region NDA of the substrate SUB. The second insulating layer INS2 is disposed on the display region DA of the substrate SUB and extends to cover a region of the non-display region NDA adjacent to the first dam member DM1.

According to an embodiment, the third insulating layer INS3 is disposed on the display region DA of the substrate SUB and extends into the non-display region NDA and includes a portion adjacent to the first dam member DM1 and on the second insulating layer INS2. The third insulating layer INS3 covers the transistors TR and TS. The second electrode E2 of the light-emitting device OLED extends into the non-display region NDA and is disposed on the third insulating layer INS3 in the non-display region NDA.

According to an embodiment, a height of a top surface of the second dam member DM2 is higher than that of a top surface of the first dam member DM1. The height of each of the first and second dam members DM1 and DM2 is defined as a distance from a bottom surface to a top surface of each of the first and second dam members DM1 and DM2. A space between the first dam member DM1 and the second dam member DM2 and a space between the first dam member DM1 and the second and third insulating layers INS2 and INS3 are grooves.

According to an embodiment, the first dam member DM1 includes a first insulating dam layer DM1_1 disposed on the substrate SUB, a second insulating dam layer DM1_2 disposed on the first insulating dam layer DM1_1, and a third insulating dam layer DM1_3 disposed on the second insulating dam layer DM1_2. The second dam member DM2 includes a fourth insulating dam layer DM2_1 disposed on the substrate SUB, a fifth insulating dam layer DM2_2 disposed on the fourth insulating dam layer DM2_1, a sixth insulating dam layer DM2_3 disposed on the fifth insulating dam layer DM2_2, and a seventh insulating dam layer DM2_4 disposed on the sixth insulating dam layer DM2_3.

According to an embodiment, each of the first to seventh insulating dam layers DM1_1-DM2_4 is formed of or includes an organic material. The fourth insulating dam layer DM2_1 and the second insulating layer INS2 are simultaneously formed of the same material. The first and fifth insulating dam layers DM1_1 and DM2_2 and the third insulating layer INS3 are simultaneously formed of the same material. The second and sixth insulating dam layers DM1_2 and DM2_3 and the pixel definition layer PDL are simultaneously formed of the same material. The third and seventh insulating dam layers DM1_3 and DM2_4 are simultaneously formed of different organic materials.

According to an embodiment, the first encapsulation layer EN1 is disposed on the substrate SUB and covers the pixels PX of the display region DA and the second electrode E2, and the first and second dam members DM1 and DM2 of the non-display region NDA. The first encapsulation layer EN1 is spaced back from an edge of the substrate SUB by a predetermined distance.

According to an embodiment, the second encapsulation layer EN2 is disposed on the first encapsulation layer EN1. The second encapsulation layer EN2 is disposed in a region defined by the first dam member DM1 adjacent to the display region DA. For example, the second encapsulation layer EN2 is disposed on a region that extends from the display region DA to a side surface of the first dam member DM1 that faces the display region DA.

According to an embodiment, the first encapsulation layer EN1 and the second encapsulation layer EN2 include inorganic materials that differ from each other. For example, the first encapsulation layer EN1 includes a first inorganic material, and the second encapsulation layer EN2 includes a second inorganic material that differs from the first inorganic material. The first and second encapsulation layers EN1 and EN2 can prevent external oxygen and moisture from infiltrating into the pixels.

According to an embodiment, the first inorganic material is silicon oxynitride (SiON). The second inorganic material is silicon oxynitride (SiON) or silicon oxide (SiOx). When both of the first and second inorganic materials include silicon oxynitride, they differ from each other in terms of the composition ratios of silicon. (Si), oxygen (O), and nitrogen (N). In this case, the first and second inorganic materials have refractive indices that differ from each other.

According to an embodiment, a surface roughness of the top surface of the second encapsulation layer EN2 is greater than a surface roughness of the top surface of the first encapsulation layer EN1. Hereinafter, the surface roughness of the top surface of the first encapsulation layer EN1 will be referred to as a 'first surface roughness', and the surface roughness of the top surface of the second encapsulation layer EN2 will be referred to as a 'second surface roughness'. The surface roughness is a root mean square (RMS) of the vertical height of surface points from a mean line and has units of length, and is a measure of roughness caused by uneven structures on a surface. The second surface roughness is greater than the first surface roughness. For example, the second surface roughness ranges from about 8.4 nm to about 35 nm, and the first surface roughness ranges from about 0.9 nm to about 2 nm.

According to an embodiment, various methods can be used to create the second surface roughness that ranges from about 8.4 nm to about 35 nm. For example, to form an inorganic insulating layer, particles made of an inorganic material are randomly provided on the substrate SUB. If an amount of an inorganic material is increased, the inorganic insulating layer will have a flat top surface, and if an amount of the inorganic material is decreased, the inorganic insulating layer will have a rough top surface. Thus, a thinner inorganic insulating layer will have an increased surface roughness.

According to an embodiment, when the second encapsulation layer EN2 is formed, particles used to form the second encapsulation layer EN2 and formed of a second inorganic material are deposited on the first encapsulation layer EN1. The amount of the second inorganic material to be deposited onto the first encapsulation layer is adjusted to control the thickness of the second encapsulation layer EN2. The thickness of the second encapsulation layer EN2 is controlled so that the second surface roughness is greater than the first surface roughness.

According to an embodiment, for the second surface roughness to be greater than the first surface roughness, the thickness of the second encapsulation layer EN2 is less than that of the first encapsulation layer EN1. For example, the thickness of the second encapsulation layer EN2 ranges from about 200 Å to about 500 Å.

According to an embodiment, the inorganic insulating layer is deposited by a chemical vapor deposition method. $NH_3$ gas is used to form an inorganic insulating layer, such as silicon oxynitride (SiON). Here, the lower is the flow rate of the $NH_3$ gas, the larger is the surface roughness of the inorganic insulating layer. In other words, the lower the ratio of N to SiON, the larger the surface roughness, i.e., the ratio of N to SiON is inversely proportional to the surface roughness.

Thus, according to an embodiment, the second surface roughness is controlled by adjusting the flow rate of the $NH_3$ gas in a process of forming the second encapsulation layer EN2. To enable the second surface roughness to be greater than the first surface roughness, the flow rate of the $NH_3$ gas is reduced when the second encapsulation layer EN2 is formed.

An embodiment of a method of adjusting a thickness and a flow rate of gas has been described, but embodiments of the inventive concept are not limited thereto. Various methods of adjusting a power and a gas supplying time can be used to control the second surface roughness.

According to an embodiment, the third encapsulation layer EN3 is disposed on the second encapsulation layer EN2. The third encapsulation layer EN3 is formed by curing a fluidic, organic material. The third encapsulation layer EN3 planarizes a top surface of the display region DA.

According to an embodiment, the fourth encapsulation layer EN4 is disposed on the first encapsulation layer EN1 and covers the third encapsulation layer EN3 in the display region DA and a portion of the non-display region NDA between the display region DA and the first dam member DM1. The fourth encapsulation layer EN4 is formed of or include an inorganic material that differs from the first and second encapsulation layers EN1 and EN2. For example, the fourth encapsulation layer EN4 includes silicon nitride (SiNx). The fourth encapsulation layer EN4 can prevent external oxygen and moisture from infiltrating into the display panel 110.

According to an embodiment, when the thin encapsulation layer TFE is formed, the fluidic organic material for forming the third encapsulation layer EN3 is coated on the substrate SUB by an inkjet printing method. If too much organic material is coated, the organic material may overflow the substrate SUB because the organic material is fluidic.

In some embodiments, even when too much organic material is coated, the organic material can be contained in grooves between the first dam member DM1 and the second dam member DM2 and between the first dam member DM1 and the second and third insulating layers INS2 and INS3. This can prevent the organic material from overflowing the substrate SUB.

According to an embodiment, the higher is the surface roughness, the greater is the spreadability of the fluid. The lower is the surface roughness, the lower is the fluid spreadability. The relationship between surface roughness and fluid spreadability will be described in more detail, when a method of fabricating a display device is described.

According to an embodiment, since the second encapsulation layer EN2 has a surface roughness greater than that of the first encapsulation layer EN1, a fluidic organic material can more effectively spread on the second encapsulation layer EN2 than on the first encapsulation layer EN1. That is, the second encapsulation layer EN2 has a high affinity with the organic material. By contrast, the organic material does not spread on the first encapsulation layer EN1, which has a lower surface roughness than the second encapsulation layer EN2. That is, the first encapsulation layer EN1 has a low affinity with the organic material.

According to an embodiment, when an organic material for forming the third encapsulation layer EN3 is disposed on the second encapsulation layer EN2, the organic material effectively spreads on the second encapsulation layer EN2 but does not spread on the first encapsulation layer EN1. Thus, an organic material can be formed on only a desired region and be prevented from overflowing the substrate SUB.

As a result, in the display device 100 according to some embodiments of the inventive concept, an organic material for forming the third encapsulation layer EN3 can be formed on a desired region and be prevented from overflowing the substrate SUB.

FIGS. 6 to 11 are sectional views that illustrate a method of fabricating a display device according to some embodiments of the inventive concept.

For convenience of illustration, a left portion of the sectional view of FIG. 4 is illustrated in FIGS. 6, 7, 8, and 11.

Figure 6:
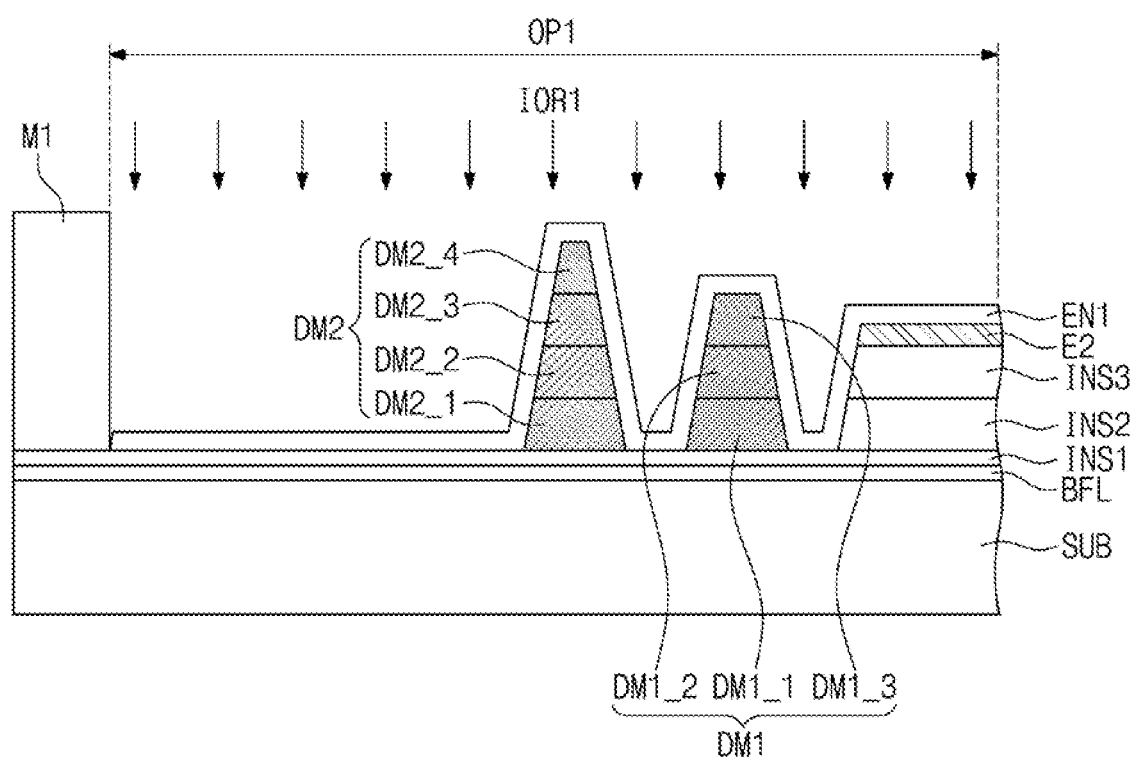
FIGS. 6 to 11 are sectional views that illustrate a method of fabricating a display device according to some embodiments of the inventive concept.

Referring to FIG. 6, according to an embodiment, the substrate SUB that includes the display region DA and the non-display region NDA is prepared. The pixels PX are disposed on the display region DA, and the first and second dam members DM1 and DM2 are disposed on the non-display region NDA.

According to an embodiment, the first encapsulation layer EN1 is disposed on the substrate SUB that cover the pixels PX and the first and second dam members DM1 and DM2. In some embodiments, a first mask M1 that has a first opening OP1 is provided on the first insulating layer INS1 in an edge region of the substrate SUB. The first opening OP1 exposes a region from the display region DA past second dam member DM2 up to a predetermined distance from the edge of the substrate SUB.

According to an embodiment, a first inorganic material IOR1 is supplied onto the substrate SUB through the first opening OP1. In some embodiments, the first inorganic material IOR1 is used to cover the pixels PX, the second electrode E2, and the first and second dam members DM1 and DM2 and to form the first encapsulation layer EN1 on the substrate SUB. Since the first encapsulation layer EN1 is formed using the first opening OP1 of the first mask M1, the first encapsulation layer EN1 is spaced apart from the edge of the substrate SUB by the predetermined distance.

Figure 7:
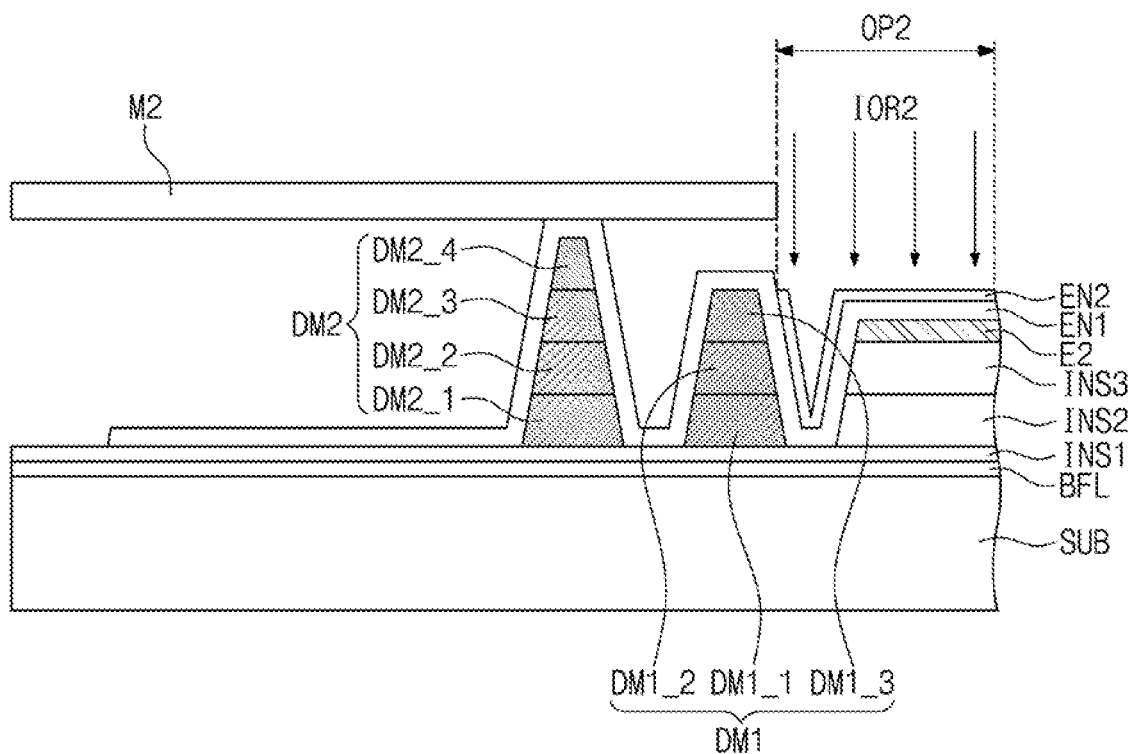

Referring to FIG. 7, according to an embodiment, a second mask M2 that has a second opening OP2 is provided on the substrate SUB, and here, the second opening OP2 exposes the display region DA and a portion, such as a side surface, of the first dam member DM1. When a mask is positioned close to a substrate, it is possible to more precisely deposit a deposition material on a desired region. In this case, the second mask M2 is placed adjacent to a top surface of the second dam member DM2. For example, in some embodiments, the second mask M2 is in contact with the top surface of the first encapsulation layer EN1 on the second dam member DM2.

According to an embodiment, a second inorganic material IOR2 is supplied onto the first encapsulation layer EN1 through the second opening OP2 to form the second encapsulation layer EN2. Due to the afore-described shape of the second opening OP2, the second inorganic material IOR2 is supplied to a region that extends from the display region DA to the side surface of the first dam member DM1. Thus, the second encapstilation layer EN2 is formed on the first encapsulation layer EN1 and covers the region from the display region DA to the side surface of the first dam member DM1.

As described above, according to an embodiment, the thickness of the second encapsulation layer EN2 and the flow rate of gas in the deposition process of the second inorganic material IOR2 are adjusted to enable the second encapsulation layer EN2 to have a second surface roughness that ranges from about 8.4 nm to about 35 nm. In addition, the second encapsulation layer EN2 has a thickness less than that of the first encapsulation layer EN1.

Figure 8:
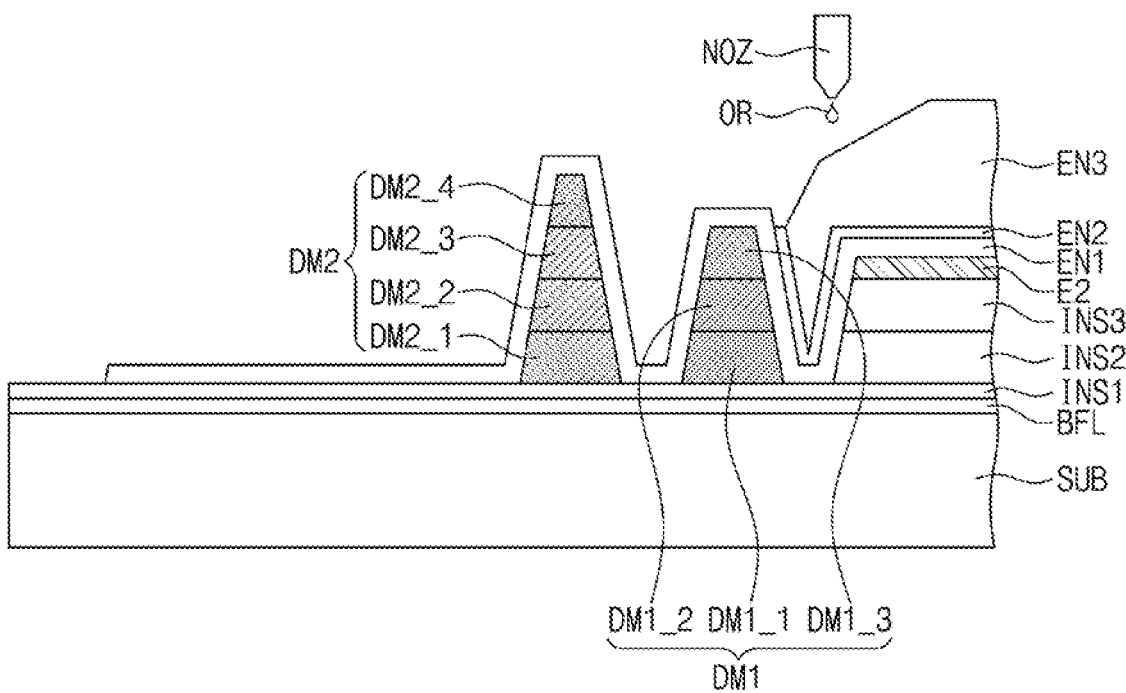

Referring to FIG. 8, according to an embodiment, an organic material OR is supplied onto the second encapsulation layer EN2 to form the third encapsulation layer EN3. In some embodiments, an inkjet printing method is used to supply the organic material OR onto the second encapsulation layer EN2 through a nozzle NOZ.

Figure 9:
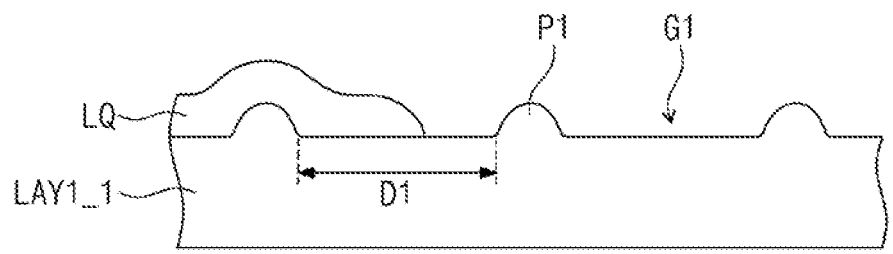
Figure 10:
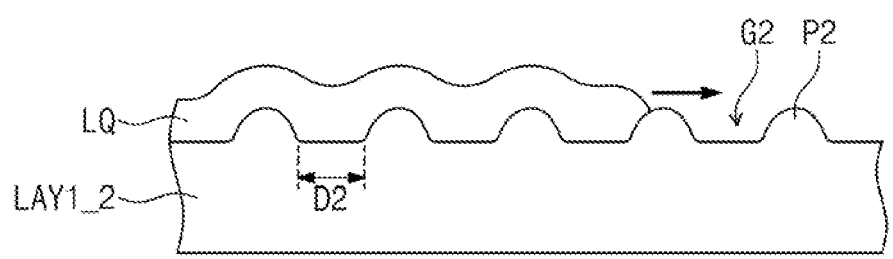

Referring to FIGS. 9 and 10, according to an embodiment, a top surface of a first layer LAY1_2 shown in FIG. 10 is formed to have a surface roughness greater than that of a top surface of a first layer LAY1_1 shown in FIG. 9. Second protruding portions P2 on the top surface of the first layer LAY1_2 of FIG. 10 are more densely provided than first protruding portions P1 on the top surface of the first layer LAY1_1 of FIG. 9. For example, a first distance D1 between two adjacent first protruding portions P1 is greater than a second distance D2 between two adjacent second protruding portions P2.

As shown in FIG. 9, according to an embodiment, when a fluid LQ is provided on the first layer LAY1_1, it takes a long time for the fluid LQ to fill first grooves G1 between the first protruding portions P1. However, as shown in FIG. 10, when the fluid LQ is provided on the first layer LAY1_2, it takes a short time for the fluid LQ to fill second grooves G2 between the second protruding portions P2. That is, as shown in FIG. 10, the greater the surface roughness, the more easily the fluid LQ can spread.

According to an embodiment, considering the relationship between surface roughness and fluid spreadability, which was described with reference to FIGS. 9 and 10, and the structure shown in FIG. 8, the organic material OR has a high spreadability on the second encapsulation layer EN2 having a high surface roughness. Thus, the organic material OR can effectively spread on the second encapsulation layer EN2, but will not effectively spread on the first encapsulation layer EN1.

According to an embodiment, the organic material OR is contained in the grooves between the first dam member DM1 and the second and third insulating layers INS2 and INS3, and thus, the organic material OR does not spread to a region of the first encapsulation layer EN1 beyond an edge of the second encapsulation layer EN2. Accordingly, the organic material OR can be formed only on a desired region and be more effectively prevented from overflowing the substrate SUB.

Figure 11:
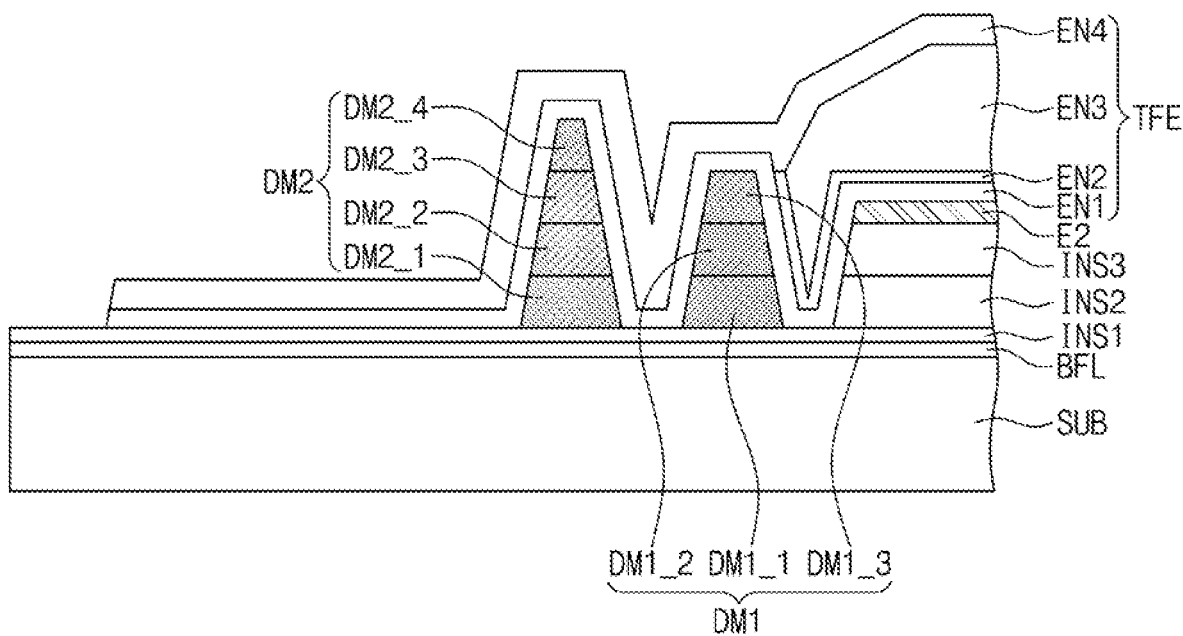

Referring to FIG. 11, according to an embodiment, the fourth encapsulation layer EN4 is formed on the first encapsulation layer EN1 and covers the third encapsulation layer EN3, and as a result, the display device 100 is fabricated.

Figure 12:
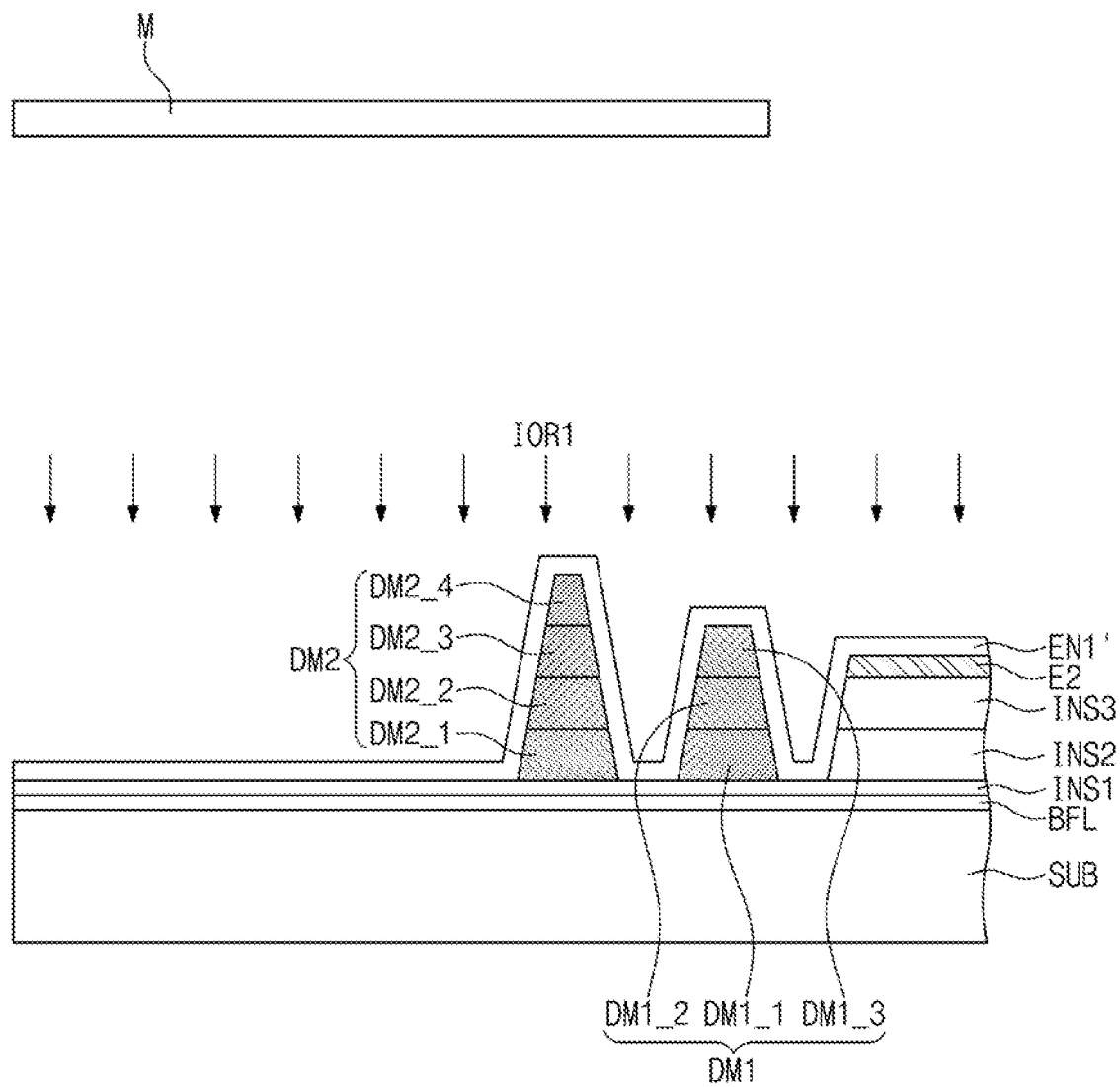
FIGS. 12 and 13 are sectional views that illustrate a method of fabricating a display device according to other embodiments of the inventive concept.
Figure 13:
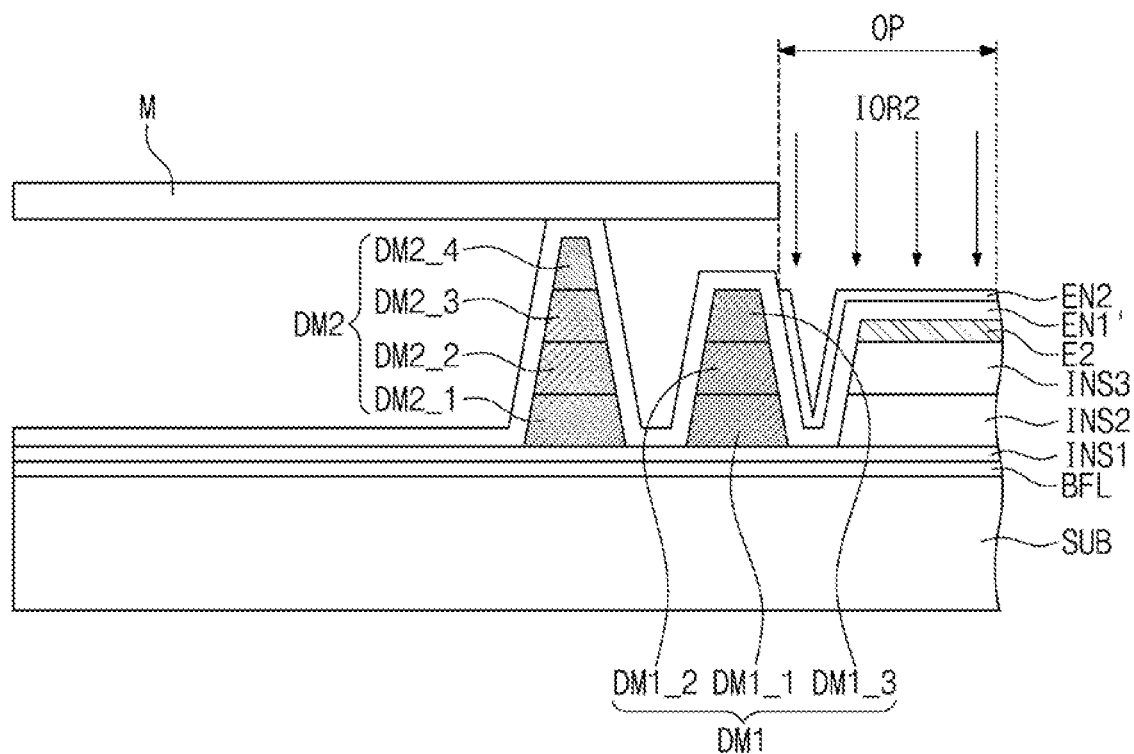

FIGS. 12 and 13 are sectional views that illustrate a method of fabricating a display device according to other embodiments of the inventive concept.

In a present embodiment, a single mask is used to form first and second encapsulation layers EN1 and EN2. Except for this, a fabrication method of FIGS. 12 and 13 can be performed in the same manner as in FIGS. 6 to 11. In the following description of FIGS. 12 and 13, an element or step previously described with reference to FIGS. 6 to 11 may be identified by the same reference number without repeating description thereof, for the sake of brevity.

Referring to FIG. 12, according to an embodiment, a process of depositing an inorganic material is performed using a mask M in a vacuum chamber and spaced apart from the substrate SUB. The mask M is positioned near a top surface of the vacuum chamber or is spaced apart from the substrate SUB by a predetermined distance.

According to an embodiment, the first inorganic material IOR1 is supplied onto the substrate SUB to form the first encapsulation layer EN1' and cover the pixels PX, the second electrode E2, and the first and second dam members DM1 and DM2. Since the mask M is spaced apart from the substrate SUB, the mask M does not block the first inorganic material IOR1. Thus, the first inorganic material IOR1 can be supplied onto the end portion of the substrate SUB. As a result, the first encapsulation layer EN1' covers the entire top surface of the substrate SUB or at least the end portion of the substrate SUB.

Referring to FIG. 13, according to an embodiment, the mask M is provided with an opening OP. For example, the mask M has substantially the same shape as the second mask M2. That is, the opening OP of the mask M expose a region that extends from the display region DA to the side surface of the first dam member DM1. The mask M is positioned adjacent to the top surface of the first dam member DM1, similar to the second mask M2.

According to an embodiment, the second inorganic material IOR2 is supplied onto the first encapsulation layer EN1' through the opening OP to form the second encapsulation layer EN2. For example, the second inorganic material IOR2 covers the region from the display region DA to the side surface of the first dam member DM1. As a result, the second encapsulation layer EN2 is formed on the first encapsulation layer EN1' and covers a region from the display region DA to the side surface of the first dam member DM1. The third encapsulation layer EN3 and the fourth encapsulation layer EN4 are formed on the substrate SUB by the same method as that described with reference to FIGS. 8 and 11, and a detailed description thereof will be omitted.

According to some embodiments of the inventive concept, a method of fabricating a display device include forming a second encapsulation layer whose affinity with an organic material is high on a first encapsulation layer and then forming an organic material on the second encapsulation layer to form a third encapsulation layer. Accordingly, the organic material for the third encapsulation layer can be placed in a desired region and be prevented from overflowing a substrate.

While exemplary embodiments of the inventive concept have been particularly shown and described, it will be understood by one of ordinary skill in the art that variations in form and detail may be made therein without departing from the spirit and scope of the attached claims.

What is claimed is:

1. A display device, comprising:
   a substrate that includes a display region and a non-display region that surrounds the display region;
   a plurality of pixels disposed on the display region of the substrate;
   a plurality of dam members disposed on the non-display region of the substrate that surround the display region;
   a first encapsulation layer disposed on the substrate that covers the plurality of pixels and the plurality of dam members;
   a second encapsulation layer disposed on the first encapsulation layer and in a region between the display region and a dam member of the plurality of dam members that is adjacent to the display region;
   a third encapsulation layer provided on the second encapsulation layer, and
   a fourth encapsulation layer disposed on the first encapsulation layer that covers the third encapsulation layer,
   wherein a surface roughness of a top surface of the second encapsulation layer is greater than a surface roughness of a top surface of the first encapsulation layer.

2. The display device of claim 1, wherein a thickness of the second encapsulation layer is less than a thickness of the first encapsulation layer.

3. The display device of claim 1, wherein
   the surface roughness of the second encapsulation layer ranges from 8.4 nm to 35 nm, and
   the surface roughness of the first encapsulation layer ranges from 0.9 nm to 2 nm.

4. The display device of claim 1, wherein
   the first encapsulation layer comprises a first inorganic material, and
   the second encapsulation layer comprises a second inorganic material that differs from the first inorganic material.

5. The display device of claim 4, wherein
   the first inorganic material is silicon oxynitride,
   the second inorganic material is silicon oxynitride or silicon oxide, and
   the first and second inorganic materials differ from each other in terms of composition ratios of silicon, oxygen, and nitrogen.

6. The displays device of claim 1, wherein the plurality of dam members comprise:
   a first dam member that surrounds the display region; and
   a second dam member that surrounds the first dam member,
   wherein a height of a top surface of the second dam member is higher than that of a top surface of the first dam member.

7. The display device of claim 6, wherein the second encapsulation layer covers a region from the display region to a side surface of the first dam member that faces the display region.

8. The display device of claim 6, wherein the first dam member comprises:
   a first insulating dam layer disposed on the substrate;
   a second insulating dam layer disposed on the first insulating dam layer; and
   a third insulating dam layer disposed on the second insulating dam layer.

9. The display device of claim 8, wherein the second dam member comprises:
   a fourth insulating dam layer disposed on the substrate;
   a fifth insulating dam layer disposed on the fourth insulating dam layer;
   a sixth insulating dam layer disposed on the fifth insulating dam layer; and
   a seventh insulating dam layer disposed on the sixth insulating dam layer.

10. The display device of claim 9, wherein each of the first to seventh insulating dam layers comprises an organic material.

11. The display device of claim 1, wherein
    the third encapsulation layer comprises an organic material, and
    the fourth encapsulation layer comprises an inorganic material different from those of the first and second encapsulation layers.

12. A display device, comprising:
    a substrate that includes a display region and a non-display region that surrounds the display region;
    a plurality of pixels disposed on the display region of the substrate;
    a plurality of dam members disposed on the non-display region of the substrate that surround the display region;

a first encapsulation layer disposed on the substrate that covers the plurality of pixels and the plurality of dam members;

a second encapsulation layer disposed on the first encapsulation layer and in a region between the display region and a dam member of the plurality of dam members that is adjacent to the display region;

a third encapsulation layer provided on the second encapsulation layer; and a fourth encapsulation layer disposed on the first encapsulation layer that covers the third encapsulation layer, wherein the first encapsulation layer comprises silicon oxynitride, the second encapsulation layer comprises silicon oxynitride or silicon oxide, and the first and second inorganic materials differ from each other in terms of composition ratios of silicon, oxygen, and nitrogen.

13. The display device of claim 12, wherein a surface roughness of a top surface of the second encapsulation layer is greater than a surface roughness of a top surface of the first encapsulation layer, and a thickness of the second encapsulation layer is less than a thickness of the first encapsulation layer.

14. A method of fabricating a display device, comprising:

preparing a substrate that includes a display region and a non-display region that surrounds the display region;

forming a plurality of pixels on the display region of the substrate;

forming a plurality of dam members on the non-display region of the substrate that surround the display region;

forming a first encapsulation layer on the substrate that covers the pixels and the dam members; and forming a second encapsulation layer on the first encapsulation layer and in a region between the display region and a dam member of the plurality of dam members that is adjacent to the display region;

forming a third encapsulation layer on the second encapsulation layer; and forming a fourth encapsulation lager on the first encapsulation layer to cover the second encapsulation and the third encapsulation layer, wherein the second encapsulation layer has a top surface whose surface roughness is greater than a surface roughness of a top surface of the first encapsulation layer.

15. The method of claim 14, wherein the plurality of dam members comprise:

a first dam member that surrounds the display region; and a second dam member that surrounds the first dam member, wherein a height of a top surface of the second dam member is higher than that of a top surface of the first dam member, and the second encapsulation layer covers a region from the display region to a side surface of the first dam member that faces the display region.

16. The method of claim 15, wherein forming the first encapsulation layer comprises:

providing a first mask on the substrate that has a first opening that exposes the display region and the first and second dam members; and supplying a first inorganic material onto the substrate through the first opening to cover the pixels and the first and second dam members and from the first encapsulation layer.

17. The method of claim 16, wherein forming the second encapsulation layer comprises:

providing a second mask on the substrate that has a second opening that exposing a region that extends from the display region to the side surface of the first dam member that faces the display region; and supplying a second inorganic material onto the first encapsulation layer through the second opening to cover a region from the display region to the side surface of the first dam member that faces the display region and form the second encapsulation layer, wherein the second mask is positioned adjacent to a top surface of the first dam member, wherein the second inorganic material is different from the first inorganic material, and wherein the third encapsulation layer comprises an organic material.

18. The method of claim 17, wherein a thickness of the second encapsulation layer and a flow rate of $NH_3$ gas used in supplying the second inorganic material are adjusted to enable the surface roughness of the second encapsulation layer to be greater than the surface roughness of the first encapsulation layer.

19. The method of claim 15, wherein forming the first encapsulation layer comprises supplying a first inorganic material onto the substrate to cover the pixels and the first and second dam members and form the first encapsulation layer, forming the second encapsulation layer comprises:

providing a mask on the substrate, the mask having an opening exposing a region from the display region to the side surface of the first dam member that faces the display region; and supplying a second inorganic material onto the first encapsulation layer through the opening to cover the region from the display region to the side surface of the first dam member that faces the display region to form the second encapsulation layer, and the mask is positioned adjacent to a top surface of the first dam member.

* * * * *